United States Patent
Hirler

(12) United States Patent (10) Patent No.: US 7,605,427 B2
Hirler (45) Date of Patent: Oct. 20, 2009

(54) FIELD PLATE TRENCH TRANSISTOR

(75) Inventor: Franz Hirler, Isen (DE)

(73) Assignee: Infineon Technologies AG, Munich (DE)

( * ) Notice: Subject to any disclaimer, the term of this patent is extended or adjusted under 35 U.S.C. 154(b) by 84 days.

(21) Appl. No.: 11/156,232

(22) Filed: Jun. 17, 2005

(65) Prior Publication Data

US 2006/0017056 A1 Jan. 26, 2006

(30) Foreign Application Priority Data

Jun. 18, 2004 (DE) .................. 10 2004 029 435

(51) Int. Cl.
*H01L 27/00* (2006.01)
(52) U.S. Cl. .................. 257/331; 257/E29.04; 438/270
(58) Field of Classification Search .................. 257/331, 257/E29.04; 438/270
See application file for complete search history.

(56) References Cited

U.S. PATENT DOCUMENTS

| | | | |
|---|---|---|---|
| 4,941,026 A | 7/1990 | Temple | |
| 5,298,781 A | 3/1994 | Cogan et al. | |
| 5,864,159 A * | 1/1999 | Takahashi | 257/330 |
| 6,515,348 B2* | 2/2003 | Hueting et al. | 257/623 |
| 2002/0030237 A1* | 3/2002 | Omura et al. | 257/397 |
| 2002/0185705 A1* | 12/2002 | Saitoh et al. | 257/492 |
| 2005/0173758 A1* | 8/2005 | Peake et al. | 257/330 |

FOREIGN PATENT DOCUMENTS

| | | |
|---|---|---|
| EP | 1 168 455 A2 | 1/2002 |
| JP | 2003243655 | 8/2003 |

* cited by examiner

*Primary Examiner*—Kenneth A Parker
*Assistant Examiner*—John Lin
(74) *Attorney, Agent, or Firm*—Maginot, Morre & Beck

(57) ABSTRACT

A field plate trench transistor has a semiconductor body which contains a plurality of trenches which are isolated from one another by mesa regions. The trenches contain gate electrodes for controlling a vertical flow of current through the semiconductor body. At least one portion of the gate electrodes are at source potential.

15 Claims, 3 Drawing Sheets

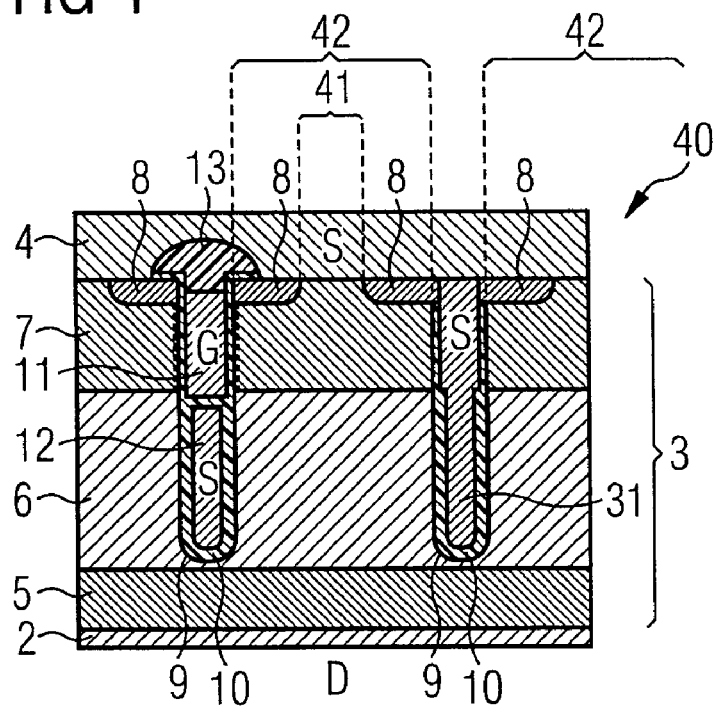
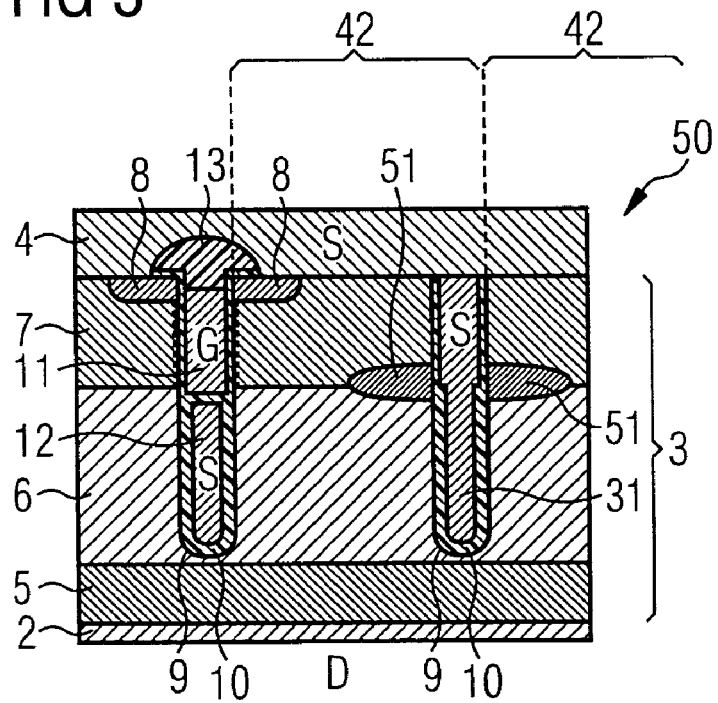

FIELD PLATE TRENCH TRANSISTOR

BACKGROUND

The invention relates to a field plate trench transistor.

Field plate trench transistors are normally designed such that they have a specific turned-on resistance $R_{on} \cdot A$ ($R_{on}$=Turned-on resistance; A=cross-sectional area of the drift zone) which is as low as possible. In addition, to minimize switching losses and to reduce the driver power of the gate actuation, the quantity of charge $Q_G$ ("gate charge") which needs to flow to the gate electrode or to drain from it in order to switch the transistor between off state/on state should be as small as possible. The required quantity of charge $Q_G$ can be relatively large both in the case of standard trench transistors (UMOS) and in the case of field plate trench transistors, which have a small pitch (width of an active cell within the cell array) and which are designed for high voltages, and can therefore entail the aforementioned drawbacks.

FIG. 1 shows a field plate trench transistor which requires a smaller quantity of charge $Q_G$ in comparison with conventional field plate trench transistors.

The field plate trench transistor 1 has a drain contact 2, a semiconductor body 3 arranged on the drain contact 2, and a source contact 4 arranged on the semiconductor body 3. The semiconductor body 3 has an n⁺-doped drain connection region 5, an n⁻-doped drift region 6 arranged on the drain connection region 5, and a p-doped body region 7 arranged on the drift region 6. The body region 7 contains n⁺-doped source regions 8. The semiconductor body 3 also contains trenches 9 whose inner walls are lined with an insulating layer 10 whose thickness may vary depending on the depth of the trench. In this case, a thinner insulating layer is used in the region of the body region 7 (channel region) than in the region of the drift region 6. Within the trenches 9, a gate electrode 11 and a field electrode 12 arranged below it are respectively formed. The gate electrode 11 is electrically insulated from the field electrode 12. In addition, the gate electrode 11 is electrically insulated from the source contact 4 by means of an insulating layer 13. The gate electrode 11 extends through the body region 7 and, in the on state, induces channels from the source regions 8 to the drift region 6 in the body region 7.

Unlike in standard trench transistors, the trenches 9 in the field plate trench transistor 1 extend entirely up to or close to the drain connection region 5. The clearing effect of the "extended" trenches allows the drift region 6 to be provided with a higher level of doping for a given breakdown voltage than in the case of a planar pn junction or a standard trench transistor. For an even higher reverse voltage, a further drift zone $6_1$ whose doping level is lower than that of the drift region $6_2$ may be provided below the trench 9.

The field electrodes 12 of the field plate transistor 1 are at source potential, and the gate electrodes 11 are at gate potential, which has the effect that, in comparison with field plate transistors with just one electrode per trench, some of the gate/drain capacitance is converted into source/drain capacitance. This means that it is possible to lower the gate charge $Q_G$ required for switching the transistor (charging/discharging the electrodes 11, 12), which entails a reduction in the switching losses and in the driver power.

In addition, U.S. Pat. No. 5,864,159 discloses a standard trench transistor (UMOS) which is shown in FIG. 7. The trench transistor has trenches 9 which, in contrast to the preceding field plate trench transistor embodiments, extend only just over the body region 7 into the drift region 6. Also, the insulating layer 10 is in a continuously thin form, that is to say has no thickened regions.

FIG. 8 shows a further known trench transistors 80. The difference from the embodiment shown in FIG. 1 is that in the two trenches 9 the gate and field electrodes are "fused" to form a common electrode 32 which is a gate potential.

SUMMARY

A desirable feature for a field plate trench transistor is allowance of a further reduction in switching losses and in the driver power of the gate actuation than that of the prior art.

The inventive field plate trench transistor has a semiconductor body containing a plurality of trenches which are isolated from one another by mesa regions (semiconductor regions between the trenches). The trenches contain gate electrodes for controlling a vertical flow of current through the semiconductor body. At least one portion of the gate electrodes (i.e. at least one portion of the electrodes which are situated next to the body regions of the field plate trench transistor) is at a potential which differs from the gate potential. This potential is preferably the source potential. Generally, any desired constant potential may be used; it is merely necessary to ensure that this potential does not vary at the same time as the gate potential, i.e. this potential should not be correlated to the gate potential such that both potentials increase or decrease at the same time. In the present description, the term "source potential" is used as a synonym for all of the possible potentials just described, for the sake of simplicity.

Accordingly, the term "gate electrode" means an electrode which is situated next to body regions formed within the mesa regions, i.e. "gate electrodes" are also those electrodes which are not at gate potential.

For the portion of the gate electrodes which is at source potential, corresponding gate/source and gate/drain capacitances are dispensed with. It is thus possible to further optimize switching losses in the field plate trench transistor and the driver power required for actuation. Those portions of the gate electrodes which are at source potential should advantageously not be too far apart from portions of the gate electrodes which are at gate potential, since too great a distance means that less or no current flows through the drift zone regions which adjoin the gate electrode portions which are at source potential, and this would reduce the electrically active drift path area. Preferably, the width of the mesa region is less than half the thickness of the drift region.

In one preferred embodiment, the gate electrodes of every second or every third trench are at source potential, whereas the rest of the gate electrodes are at gate potential. Alternately, it is possible for portions of a single gate electrode to be at source potential and for the remaining portions of this gate electrode to be at gate potential.

The field electrodes arranged below gate electrodes which are at source potential may in this case be at source potential or at another suitable potential or may be floating and fused to the gate electrodes to form a common electrode. Similarly, field electrodes arranged below gate electrodes which are at gate potential may be at source potential or at another suitable potential or may be floating, and fused to the gate electrodes to form a common electrode.

The gate electrodes or field electrodes within the trenches may be in a form such that source potentials or gate potentials at which the gate electrodes/field electrodes are situated vary in a lateral direction along the trenches. To this end, by way of example, the gate electrodes or field electrodes may each be split into a plurality of sections which are insulated from one another and are put at a different potential.

Normally, the mesa regions between the trenches are provided with source, body and drift regions, and contact is made with the source or body regions from above through appropriate contact holes/contact trenches and possibly suitable contact dopant regions. In one preferred embodiment, these contacts are not limited to the mesa region between two trenches, but rather make contact simultaneously with two adjacent mesa regions and with the source-potential gate electrode of the trench situated between the mesa regions. This allows the pitch of the field plate trench transistor to be reduced.

In one preferred embodiment, the thicknesses of the insulating layers which enclose the gate electrodes or field electrodes are in a thinner form in the region of the body regions than in the region of the drain regions. This may be achieved, by way of example, by virtue of the thickness of the insulating layer increasing or decreasing continuously in a vertical direction.

The inventive field plate trench transistor allows a reduction in the channel width without the need for a significant change in the cell spacing of the field plate trench transistor. Although reducing the channel width increases the channel resistance, this is of no matter in field plate trench transistors designed for high breakdown voltages, since in this case the channel resistance is low in comparison with the drift path resistance. Conventional field plate trench transistors which have a reduced channel width (i.e. a larger pitch) need to have a lower level of doping (epidoping) in order to be able to be used for the same breakdown voltage, and this results in a higher resistance for the drift path and hence in an increased turned-on resistance. This drawback is avoided by the inventive field plate trench transistor.

Normally, a (semiconductor) drain zone is formed within the semiconductor body. In one preferred embodiment, the lower ends of the trenches are situated within a region which extends in a vertical direction, starting from an upper region of the drain zone upward until a vertical position is reached which is spaced approximately the width of a mesa region apart from the drain zone. In other words: the lower ends of the trenches project no further than into the drain zone or are arranged spaced apart from the drain zone by no more than a distance which corresponds approximately to the width of a mesa region.

In a further possible embodiment, a first drift zone is arranged above the drain zone and a second drift zone is arranged on the first drift zone, the first drift zone having a (substantially) lower doping level than the second drift zone, and the lower ends of the trenches being situated within a region which, starting from an upper region of the first drift zone, extends upwards until a vertical position is reached which is spaced approximately the width of a mesa region apart from the first drift zone. In other words: the lower ends of the trenches project no further than into the first drift zone or are arranged so as to be spaced apart from the first drift zone. In this context, the distance apart corresponds to no more than approximately the width of a mesa region.

BRIEF DESCRIPTION OF THE DRAWINGS

The invention is explained in more detail below in an exemplary embodiment with reference to the figures, in which:

FIG. 4 shows a cross-sectional illustration of a third embodiment of an inventive field plate trench transistor, FIG. 5 show a cross-sectional illustration of a fourth embodiment of an inventive field plate trench transistor.

DESCRIPTION

Figure 1:
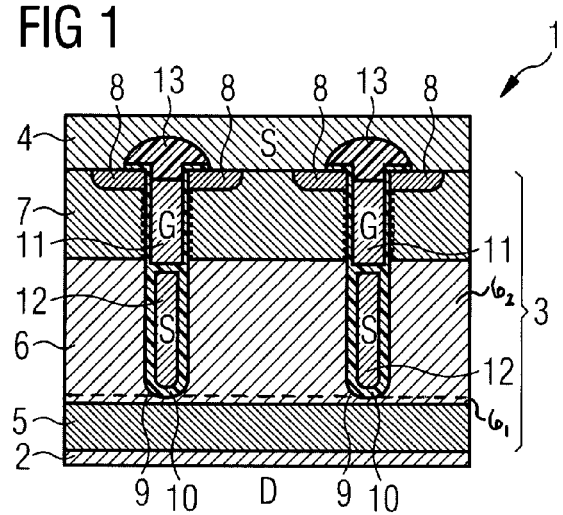
FIG. 1 shows a cross-sectional illustration of a conventional field plate trench transistor.

In the figures, identical or mutually corresponding parts are identified by the same reference numerals. In addition, all of the embodiments may have the opposite doping, that is to say n-type regions and p-type regions can be interchanged with one another.

Figure 2:
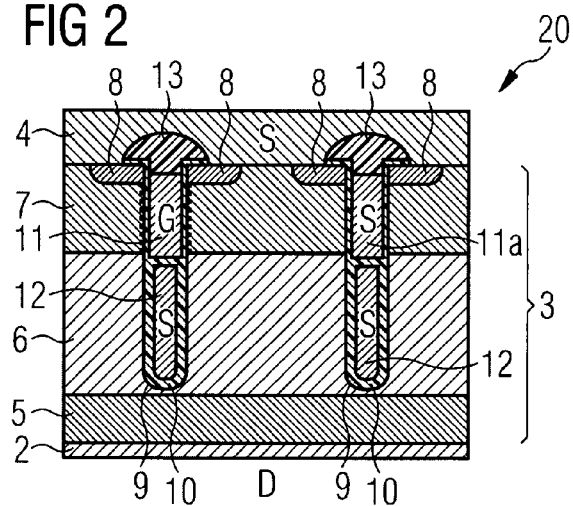
FIG. 2 shows a cross-sectional illustration of a first embodiment of an inventive field plate trench transistor.

The embodiment shown in FIG. 2 differs from the embodiment shown in FIG. 1 merely by virtue of the gate electrode 11a in the right-hand trench 9 not being at gate potential, as in the left-hand trench 9, but rather at source potential. Preferably, the gate electrode 11a of each second trench 9 is at source potential, but it is also possible to for just every third or fourth or any gate electrode 11 to be at source potential. Preferably, gate electrodes which are at gate potential alternate with gate electrodes which are at source potential. It is also possible to use other potentials which are independent of the gate potential instead of the source potential. If the mesa regions between the trenches 9 are in a narrow form, channel currents may very quickly be distributed over the entire width of the drift path from the mesa end with a gate electrode which is at gate potential. If a reduction in the channel width is therefore produced in the inventive field plate trench transistor, this has hardly any drawback for the distribution of current in the drift path. By way of example, halving the channel width for the field plate trench transistor 1 in FIG. 1 results in the gate charge $Q_G$ being halved. This allows significantly shorter switching times to be achieved, or the driver power can be halved for the same switching time.

Figure 3:
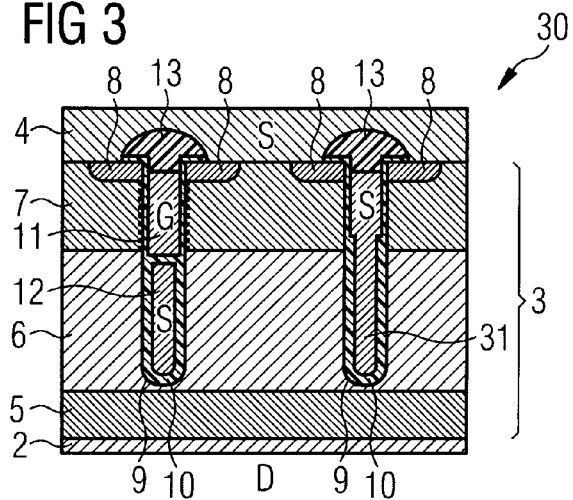
FIG. 3 shows a cross-sectional illustration of a second embodiment of an inventive field plate trench transistor.

The second embodiment 30 shown in FIG. 3 differs from the first embodiment 20 shown in FIG. 2 in that the gate electrode 11 and the field electrode 12 in the right-hand trench 9 are electrically fused to one another to form a common electrode 31. In this context, the insulating layer 10 may be in thickened form not only in the lower region of the trench 9 but also in portions of the upper region or in the total upper region of the trench 9.

The third embodiment 40 shown in FIG. 4 differs from the second embodiment 30 shown in FIG. 3 in that the common electrode 31 has a direct electrical connection to the source contact 4, that is to say that the insulating layer 13 is omitted. In addition, the common electrode 31 is also in contact with the adjoining source regions 8, which likewise have an electrical connection to the source contact 4. The source region 8 adjoining the common electrode 31 may also be omitted. In this embodiment, a contact region 41 (which may also partly be in the form of a trench contact) is not limited to the mesa region 42 between two adjacent trenches 9, but rather simultaneously makes contact with two adjacent mesa regions 42 and with the common electrode 31 of the trench situated between the mesa regions. This allows a smaller pitch with a lower resistance for the drift path to be achieved.

The fourth embodiment 50 shown in FIG. 5 differs from the third embodiment 40 shown in FIG. 4 in that the source regions 8 which adjoin the right-hand trench 9 with the common electrode 31 are omitted and instead n-doped regions 51 are arranged within the body region 7, that is to say at the junction between the body region 7 and the drift region 6. The n-type regions 51 adjoin the right-hand trench 9 and may, in principle, also be arranged at other locations within the mesa regions 42. The effect of providing the n-type regions 51 is a better distribution of current within the mesa regions 42. The n-type regions 51 may also be of any shape, but should be in a form such that the channel length is not excessively shortened within the body region 7. The provision of the n-type region within the body region 7 makes sense particularly when the source regions 8 adjoining the trenches 9 with a source electrode in the upper region are omitted or are replaced by a contact trench with a p+-type body contact in the contact trench base.

Figure 6:
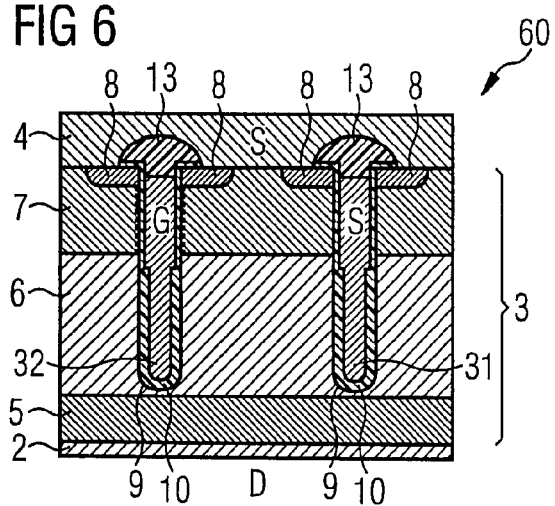
FIG. 6 shows a cross-sectional illustration of a fifth embodiment of an inventive field plate trench transistor.

The fifth embodiment 60 shown in FIG. 6 differs from the second embodiment 30 in that the left-hand trench 9, that is to say the trench in which the gate electrode 11 is at gate potential, also has the gate electrode 11 and the field electrode 12 fused to form a common electrode 32, the common electrode 32 being at gate potential.

The source and gate potentials may vary along the trench strip. In this case, the distribution of currents in the drift path means that the electrodes at source potential should be as short as possible and should be opposite electrodes which are at gate potential in the adjacent trench.

Figure 7:
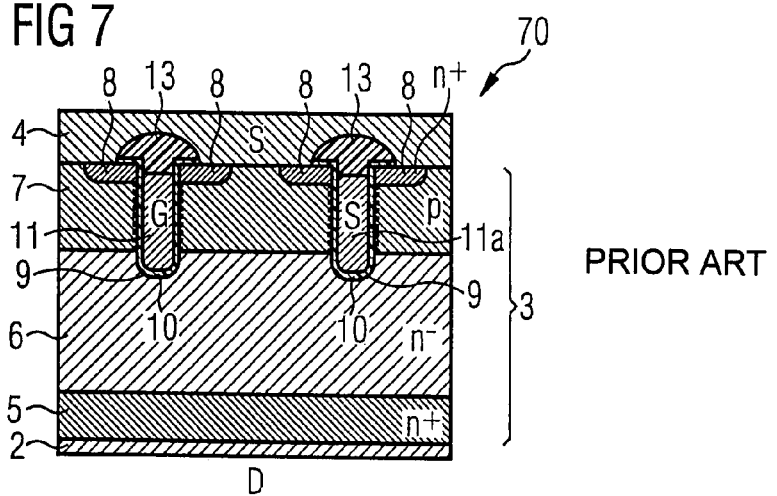
FIG. 7 shows a cross-sectional illustration of a trench transistor based on the prior art.
Figure 8:
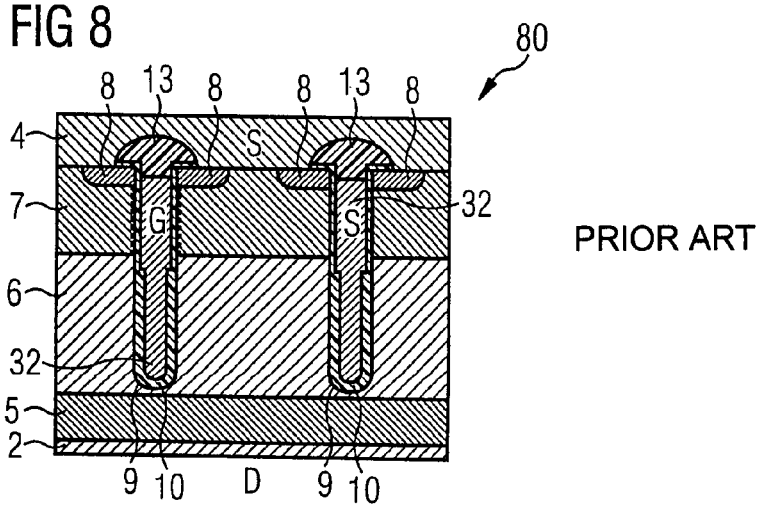
FIG. 8 shows a cross-sectional illustration of a trench transistor based on the prior art.

The trench transistor 70 shown in FIG. 7 is a "standard trench transistor" (UMOS) and has trenches 9 which, in contrast to the preceding field plate trench transistor embodiment, extend only just over the body region 7 into the drift region 6. In addition, the insulating layer 10 is in continuously thin form, that is to say has no thickened regions.

In order to illustrate the advantage of the inventive structure over standard trench transistors, which are described in U.S. Pat. No. 5,864,159, for example, the text below will look at the addition of a further trench with electrodes at source potential between two trenches:

The specific resistance of the drift path in the trench transistor 70 shown in FIG. 7 is given by:

$$R_o, on = \frac{L_0}{(\mu \times N_0 \times q)} = \frac{4V_b^2}{\mu \varepsilon E_{AV}^3}.$$

In this case, $L_0$ is the depth or length of the drift region, $N_0$ is the doping concentration within the drift region, $\mu$ is the mobility of the semiconductor materials, q is the elemental charge, $\varepsilon$ is the dielectric constant of the semiconductor material, $E_{AV}$ is the electrical avalanche field for an N-doped drift region, and $V_b$ is the breakdown voltage.

Hence, the addition of a trench with a gate electrode at source potential between two trenches with gate electrodes whose potential is at gate potential does not change the specific resistance $R_0$ of the drift path and the gate charge ($L_0$ and $N_0$ cannot be varied). In this case, the addition of a trench with a gate electrode which is at source potential brings about only a reduction in the field strength (i.e. expansion of the equipotential lines) of adjacent insulating layers in the adjacent trenches, i.e. in the trenches in which there is a gate electrode at gate potential.

The situation is different in a field plate trench transistor, particularly in the case of the embodiments 20 to 60 described above. There, the equation for the specific resistance of the drift path is as follows:

$$R_{on} = \frac{L}{(\mu \times N \times q)} \times \frac{(W + W_T)}{W} = \frac{V_b \times (W + W_T)}{2\mu \varepsilon E_{AV}^2}$$

In this case, L is the length of the drift region extending between the base and substrate regions which are adjacent to source and drain electrodes, $\mu$ is the mobility of the semiconductor material, N is the carrier concentration within the drift region, q is the elemental charge, W is the width of the mesa region, $W_T$ is the width of the trench, $\varepsilon$ is the dielectric constant of the semiconductor material, $E_{AV}$ is the electrical field in avalanche breakdown, and $V_b$ is the breakdown voltage.

In this context, N is dependent on the mesa width W, which can be reduced by adding an additional trench with a gate electrode at source potential (the charge W×N between two trenches is constant), and is given by:

$$N = \frac{2 \times \varepsilon \times E_{AV}}{q \times W}.$$

In addition to reducing the field strength at the oxide stage in the trenches, the inventive field plate trench transistor is therefore able to achieve a significant improvement in the specific drift path turned-on resistance without the need to increase the gate charge. This applies particularly to transistors which are designed for voltages of 100 V upwards, since in this case the specific resistance (drift path resistance) of the substrate (for example the epitaxial layer) is dominant. When considering transistors with the same $R_{on}$, a smaller chip area (number of cells) is required, and lower capacitances are achieved.

LIST OF REFERENCE SYMBOLS

1 Field plate trench transistor
2 Drain contact
3 Semiconductor body
4 Source contact
5 Drain connection region
6 Drift region
7 Body region
8 Source region
9 Trench
10 Insulating layer
11 Gate electrode
11a Gate electrode at source potential
12 Field electrode
13 Insulating layer
20 First embodiment
30 Second embodiment
31 Common electrode
32 Common electrode
40 Third embodiment
42 Contact region
42 Mesa region
50 Fourth embodiment
51 n-type region
60 Fifth embodiment
70 Trench transistor
80 Trench transistor

The invention claimed is:

1. A field plate trench transistor comprising:
a semiconductor body containing a plurality of trenches which are isolated from one another by mesa regions, the trenches containing gate electrodes operable to control a vertical flow of current through the semiconductor body,
wherein a first plurality of the gate electrodes is configured such that when a gate potential and a source potential are applied to the field plate trench transistor, the first plurality of the gate electrodes is at the source potential which differs from the gate potential, and the remaining gate electrodes which form a second plurality of the gate electrodes are configured such that when the gate potential and the source potential are applied to the field plate trench transistor, the second plurality of the gate electrodes are at the gate potential, and
below the second plurality of the gate electrodes within the trenches there are field electrodes which are configured such that when the gate potential and the source potential are applied to the field plate trench transistor, the field electrodes are at the source potential.

2. The field plate trench transistor of claim 1 wherein a drain zone is formed within the semiconductor body.

3. The field plate trench transistor of claim 2 wherein the trenches include lower ends situated within a region, which extends in a vertical direction starting from an upper region of the drain zone upward until a vertical position is reached which is spaced approximately the width of one of the mesa regions apart from the drain zone.

4. The field plate trench transistor of claim 3 wherein a first drift zone is arranged above the drain zone and a second drift zone is arranged on the first drift zone, the first drift zone having a lower doping level than the second drift zone, and the lower ends of the trenches being situated within a region which extends upward from an upper region of the first drift zone until a vertical position is reached which is spaced approximately the width of a mesa region apart from the first drift zone.

5. The field plate trench transistor of claim 1 wherein the gate electrodes of every second trench are configured such that they are at the source potential, and the remaining gate electrodes are configured such that they are at the gate potential.

6. The field plate trench transistor of claim 1 wherein the gate electrodes of every third trench are a configured such that they are at the source potential, and the remaining gate electrodes are configured such that they are at the gate potential.

7. The field plate trench transistor of claim 1 wherein the potential of the gate electrodes and field electrodes varies in a lateral direction along the trenches.

8. The field plate trench transistor of claim 1 further comprising body regions and source regions contained in the semiconductor body, wherein a contact makes simultaneous contact with one of the body regions and one of the source regions in two adjacent mesa regions and with the gate electrode of the trench situated between the two adjacent mesa regions.

9. The field plate trench transistor of claim 8 wherein the semiconductor body further comprises drift regions positioned below the body regions in the semiconductor body, wherein insulating layers line the sidewalls of the trenches and enclose the gate electrodes and field electrodes, and wherein thicknesses of the insulating layers which line the side walls of the trenches are thinner in the body regions than in the drift regions.

10. A field plate trench transistor comprising
a) a semiconductor body;
b) a plurality of trenches contained in the semiconductor body, the plurality of trenches being isolated from one another by mesa regions, wherein the plurality of trenches contain
 i) first and second gate electrodes operable to control a vertical flow of current through the semiconductor body and
 ii) field electrodes which underlie the gate electrodes and are configured such that when a gate potential and a source potential are applied to the field plate trench transistor, the field electrodes are at the source potential; and
wherein the first gate electrodes are insulated from the underlying field electrodes and are configured such that when the gate potential and the source potential are applied to the field plate trench transistor, the first gate electrodes are at the gate potential. and the second gate electrodes are configured such that when the gate potential and the source potential are applied to the field plate trench transistor, the second gate electrodes are at the source potential,
wherein the first and second gate electrodes are electrically insulated from a source contact by means of an insulating layer, and
wherein the first and second gate electrodes traverse source regions.

11. The field plate trench transistor of claim 10 further comprising a drain zone formed within the semiconductor body.

12. The field plate trench transistor of claim 11 wherein the plurality of trenches include lower ends situated within a region extending in a vertical direction from an upper region of the drain zone upward to a vertical position approximately the width of one of the mesa regions apart from the drain zone.

13. The field plate trench transistor of claim 12 wherein a first drift zone is arranged above the drain zone and a second drift zone is arranged on the first drift zone, the first drift zone having a lower doping level than the second drift zone, and the lower ends of the plurality of trenches being situated within a region extending in a vertical direction from an upper region of the first drift zone upward to a vertical position which is spaced approximately the width of a mesa region apart from the first drift zone.

14. The field plate trench transistor of claim 10 further comprising body regions and source regions contained in the semiconductor body, and further comprising a contact which makes simultaneous contact with one of the body regions and one of the source regions in two adjacent mesa regions.

15. The field plate trench transistor of claim 14 further comprising drift regions contained in the semiconductor body and underlying the body regions, and wherein insulating layers line the sidewalls of the trenches and enclose the first and second gate electrodes and field electrodes, and wherein the thicknesses of the insulating layers which line the side walls of the trenches are thinner in the region of the body regions than in the region of the drift regions.

* * * * *